United States Patent [19]
Kawasaki et al.

[11] Patent Number: 5,521,457
[45] Date of Patent: May 28, 1996

[54] HOLDING STRUCTURE FOR A PIEZOELECTRIC VIBRATOR

[75] Inventors: Osamu Kawasaki, Tsuzuki-Gun; Hidenobu Shintaku, Neyagawa; Shigeo Suzuki; Masahiro Nagasawa, both of Hirakata; Hiroshi Fukushima, Katano; Hirofumi Tajika, Osaka, all of Japan

[73] Assignee: Matsushita Electric Industrial Co., Ltd., Osaka, Japan

[21] Appl. No.: 249,738

[22] Filed: May 26, 1994

[30] Foreign Application Priority Data

| May 28, 1993 | [JP] | Japan | 5-126920 |
| May 28, 1993 | [JP] | Japan | 5-126921 |
| Aug. 23, 1993 | [JP] | Japan | 5-207652 |
| Mar. 8, 1994 | [JP] | Japan | 6-036963 |

[51] Int. Cl.⁶ ............................................ H01L 41/08
[52] U.S. Cl. ........................................ 310/352; 310/354
[58] Field of Search ............................ 310/348, 351–356

[56] References Cited

U.S. PATENT DOCUMENTS

| 2,133,643 | 10/1938 | Pierce | 310/354 X |
| 3,906,249 | 9/1975 | Gibert | 310/352 |
| 4,025,806 | 5/1977 | Weber | 310/352 |
| 4,183,126 | 1/1980 | Ikeno et al. | 310/352 X |
| 4,418,299 | 11/1983 | Momosaki | 310/352 X |
| 5,250,870 | 10/1993 | Fenlon | 310/352 X |

FOREIGN PATENT DOCUMENTS

| 5-20422 | 3/1993 | Japan . |
| 5-23617 | 3/1993 | Japan . |

*Primary Examiner*—Mark O. Budd
*Attorney, Agent, or Firm*—Wenderoth, Lind & Ponack

[57] ABSTRACT

Protrusions made of an electrically conductive material such as a metal or ceramic are formed around a node point or a node line of vibrations of a piezoelectric plate on two principal planes thereof by a spraying process. The piezoelectric plate is held at the protrusions with leaf springs on the two principal planes. Thus, protrusions of a small surface area are formed without deteriorating the piezoelectric plate. The piezoelectric plate can be held stably without deteriorating the vibration characteristics. An alternating voltage is applied to electrodes of the piezoelectric plate through the electrically conductive protrusions. Because a spraying process is used, the protrusions can be thickly and precisely formed in a small area and held surely and reliably, with a good mechanical strength of the protrusions.

27 Claims, 16 Drawing Sheets

1

HOLDING STRUCTURE FOR A PIEZOELECTRIC VIBRATOR

BACKGROUND OF THE INVENTION

1. Field of the Invention

The present invention relates to a piezoelectric vibrator made from a piezoelectric material such as a piezoelectric ceramic, quartz or lithium niobate, which can be used as a component of an oscillator, a ceramic filter or the like, and in particular to a holding structure of the piezoelectric vibrator and a manufacturing method thereof.

2. Description of the Prior Art

A piezoelectric vibrator is used as a mechanical filter, an oscillator, an actuator or the like and is made from a piezoelectric material such as a piezoelectric ceramic, quartz or lithium niobate. A suitable vibration mode such as bending vibration or extensional vibration is selected according to a frequency range to be used. When an alternating electric voltage is applied to a piezoelectric vibrator, it is vibrated due to the piezoelectric effect with a low vibration loss. Such a piezoelectric vibrator has large mechanical quality factors $Q_m$ and large coupling factors. Therefore, a ceramic filter can have a wider range and a vibrator has a better frequency precision than an LC filter and a vibrator using a capacitor and a coil.

In order to utilize such features of a piezoelectric vibrator, it is important to support or fix a piezoelectric vibrator correctly and surely at a node where the vibration amplitude becomes zero so as not to suppress vibrations generated in the piezoelectric vibrator in a holding structure thereof.

A node in a piezoelectric vibrator is a point or a line without zero area. Therefore, it is desirable that the holding structure holds a piezoelectric vibrator at a point or at a line. However, it is practically impossible to hold a piezoelectric vibrator at a point or at a line. Further, it is also required to be stably held. Thus, a piezoelectric vibrator is held in practice at a point-like area or at a linear area by sacrificing the characteristics thereof somewhat.

Previously, a piezoelectric vibrator was supported or fixed around a node with the use of springs. However, this technique the following problems: (1) It is difficult to set positions for supporting or fixing a piezoelectric vibrator correctly around a node. (2) If a piezoelectric vibrator is supported or fixed strongly or a strong force is applied to the piezoelectric vibrator for supporting or fixing it surely, the characteristics of the piezoelectric vibrator are deteriorated or the piezoelectric vibrator is destroyed mechanically. (3) It is needed to support or fix a piezoelectric vibrator on a certain area in order to hold it at a particular posture. However, because a node of the piezoelectric vibrator is a point or a line with no area, this means that vibrating portions in the piezovibrator are held or fixed. Therefore, vibrations are suppressed and characteristics of the piezoelectric vibrator are deteriorated.

FIG. 1 illustrates a concept of the holding of a piezoelectric vibrator 1 at points. Driving electrodes 2 are formed on two opposing principal planes of a piezoelectric vibrator 1, a square plate made of a piezoelectric material. When an alternating voltage is applied to the driving electrodes 2, extensional vibrations of the square plate are generated. Because the vibrations have a node point at a center of the square plate, the piezoelectric vibrator 1 is held by holders 3 to interpose it between two sides with an applied pressure. A top of the holder 3 has a flat region with a certain area, and the piezoelectric vibrator 1 is held stably by abutting it to the flat regions of the holder 3 at two principal planes. Further, the elastic property of the holder 3 buffers vibrations propagated from the outside.

FIG. 2 illustrates the concept of holding a piezoelectric vibrator 1 at a line. Driving electrodes 5 are formed on two opposing principal planes of a piezoelectric vibrator 4, a rectangular plate made of a piezoelectric material. When an alternating voltage is applied to the driving electrodes 5, longitudinal vibrations of the rectangular plate are generated having main displacements along longitudinal direction of the rectangular plate. Because the vibrations have a node line at a center line of the rectangular plate, the piezoelectric vibrator 4 is held at two principal planes with an applied pressure by interposing it between two holders 6. A top of the holder 6 has a flat region with a certain area, and the piezoelectric vibrator 4 is held stably by abutting the flat regions thereto at two sides. Further, the elastic property of the holder 6 buffers vibrations propagated from the outside.

As described above, prior art holding structures hold a piezoelectric vibrator directly with holders at point-like areas or at line-like areas having a certain area. Therefore, if the contact areas for holding are decreased, the holding becomes unstable. Further, when a shock is given, for example by the vibrator falling to the ground, the posture or position is liable to be changed the and this causes vibration characteristics to greatly change. On the other hand, if the holding area is increased, a part of the vibrating region is pressed and both mechanical quality factors and coupling factors decrease to deteriorate the vibration characteristics. Because a piezoelectric vibrator is held directly with holders, a contact area between the vibrator and the holder and a holding position of the holders vary for each piezoelectric vibrator. Then it is also a problem that the characteristic of the piezoelectric vibrator scatters. To sum up, it is difficult to hold a piezoelectric vibrator stably and reliably without affecting the vibrator characteristics.

In order to solve the above-mentioned problems, it has been proposed to form protrusions at positions for supporting or fixing a piezoelectric vibrator and to support it at the protrusions. This technique has an advantage in that if protrusions can be formed correctly at a node, the position for supporting or fixing can be set surely around the node. Previously, such protrusions were formed with a hard soldering process, a soldering process or a plating for a metallic material and with a printing process for an organic electrically conductive paint. The protrusions were made of an electrically conducting material because electrical leads are connected at the protrusions.

Japanese Utility Model laid open Publication 20422/1993 proposes a holding structure for a piezoelectric vibrator wherein protrusions made of electrically conductive rectangular rubber are formed around a node point of vibrations of a piezoelectric vibrator and the piezoelectric vibrator is held at the protrusions. However, this holding structure has a problem in that the protrusions are deformed by the pressure applied for holding. Then a contact area between the vibrator and the holders is not constant among piezoelectric vibrators, and the characteristics of the piezoelectric vibrator varies greatly.

Japanese Utility Model laid open Publication 23617/1993 proposes a holding structure for a piezoelectric vibrator wherein metallic protrusions are formed around a node of vibrations of a piezoelectric vibrator and the piezoelectric vibrator is held at the protrusions. It is proposed to produce protrusions by soldering, welding, melting, adhesion or the like. However, when the protrusions are produced with a technique using heating, the temperature of the piezoelectric vibrator is liable to be heated to deteriorate the characteristics of the piezoelectric vibrator. The deterioration is especially large for a piezoelectric vibrator made of a piezoelectric ceramic having a low Curie temperature. Generally, the Curie temperature of a piezoelectric ceramic is 250°–350° C., and when a piezoelectric vibrator is heated for a long time at say 125° C. or above, the characteristics are greatly deteriorated. In an example, a piezoelectric ceramic of 300° C. of Curie temperature is heated for an hour, a piezoelectric constant is found not to change for heating at 140° C. or lower, but to change for heating above it. It is also found that the piezoelectric constant decreases in a shorter time with an increasing heating temperature. If the metallic protrusions are formed with adhesion without heating it is a problem in that an adhesive agent extends outside the contact areas. This also greatly scatters and deteriorates the characteristics of the piezoelectric vibrator.

SUMMARY OF THE INVENTION

An object of the invention is to provide a new holding structure for a piezoelectric vibrator which can hold a piezoelectric vibrator reliably and stably without deteriorating the vibration characteristics thereof.

Another object of the invention is to provide a method of producing the new holding structure of the piezoelectric vibrator.

In one aspect of the invention, a piezovibrator comprises a piezoelectric plate made of a piezoelectric material having electrodes formed on two principal planes thereof. A protrusion made from an electrically conductive material is formed on a node of vibrations of the piezoelectric plate on each of the principal planes of the piezoelectric plate. The protrusions have a top surface with a roughness of a few micrometers or more, and they are formed, for example, by a spraying process. Thus, electrically conductive hard protrusions can be formed without heating. A holder means holds the piezoelectric plate at the protrusion on each of the principal planes of the piezoelectric plate. A contact area between the piezoelectric plate and the holder means is kept small, and the contact is kept strong. Even if the relative position between them is displaced somewhat a the holding position as viewed from the piezoelectric plate is kept constant.

An advantage of the holding structure of the piezoelectric vibrator of the present invention is that the excellent characteristics of a piezoelectric vibrator is kept stable and has little scattering.

An advantage of a manufacturing method of a Piezoelectric vibrator of the present invention is that holding structure of the piezovibrator can be formed at a low temperature without affecting the vibration characteristics of the piezovibrator.

BRIEF DESCRIPTION OF THE DRAWINGS

The above and other objects and features of the present invention will become clear from the following description, taken in conjunction with the preferred embodiments thereof, with reference to the accompanying drawings, in which.

DETAILED DESCRIPTION OF THE PREFERRED EMBODIMENTS

Figure 1:
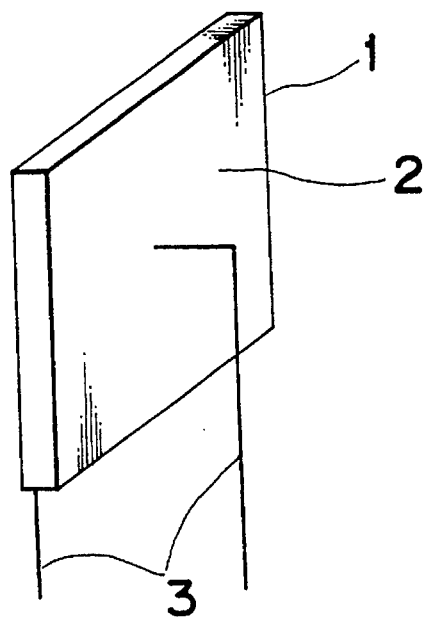
FIG. 1 is a schematic perspective view of a prior art piezoelectric vibrator held at points.
Figure 2:
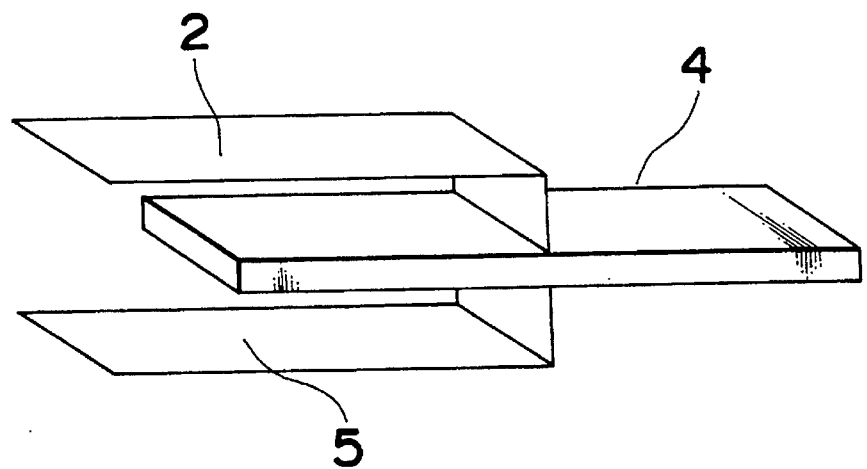
FIG. 2 is a schematic perspective view of a prior art piezoelectric vibrator held at lines.

Referring now to the drawings, wherein like reference characters designate like or corresponding parts throughout the views, embodiments of the invention are explained. In the present invention, protrusions are formed on a piezoelectric plate around a node of vibrations by depositing particles of electrically conductive material such as a metal or a ceramic with a spraying process or the like. Then, the piezoelectric plate is held by holder means by contacting the top of the protrusions with the holder means.

The following advantages can be realized by using protrusions formed by using a spraying process or the like. (1)

When the protrusions are formed, the temperature of a piezoelectric plate does not become so high as to deteriorate the characteristics thereof. (2) The protrusions can be formed thick enough to stabilize a supporting or fixing posture and the holding means are prevented from contacting the piezoelectric plate even if the posture changes a little. Such protrusions can be formed thick in a short time with a spraying process because sprayed particles have larger sizes than particles deposited in vacuum deposition, sputtering deposition or the like. (3) The protrusions have a high mechanical strength and a high adhesion strength to prevent them from sliding against the piezoelectric plate even if an external shock is applied to the piezoelectric plate on falling or the like. Because the particles to be deposited as the protrusions have larger sizes in the spraying process than in a sputtering process or the like they stick into the piezoelectric plate more strongly and more surely when the protrusions are formed. (4) The protrusions have rough surfaces because sprayed particles to be deposited as the protrusions have large sizes in a spraying process. Then, they can be stuck into a holding member like wedges so that they can support or fix the piezoelectric plate stably and surely even if they are not pressed so strongly to the holding member. (5) Protrusions can be precisely formed only around nodes of vibrations and with a fine pitch in order not to suppress vibrations.

Figures 3, 4:
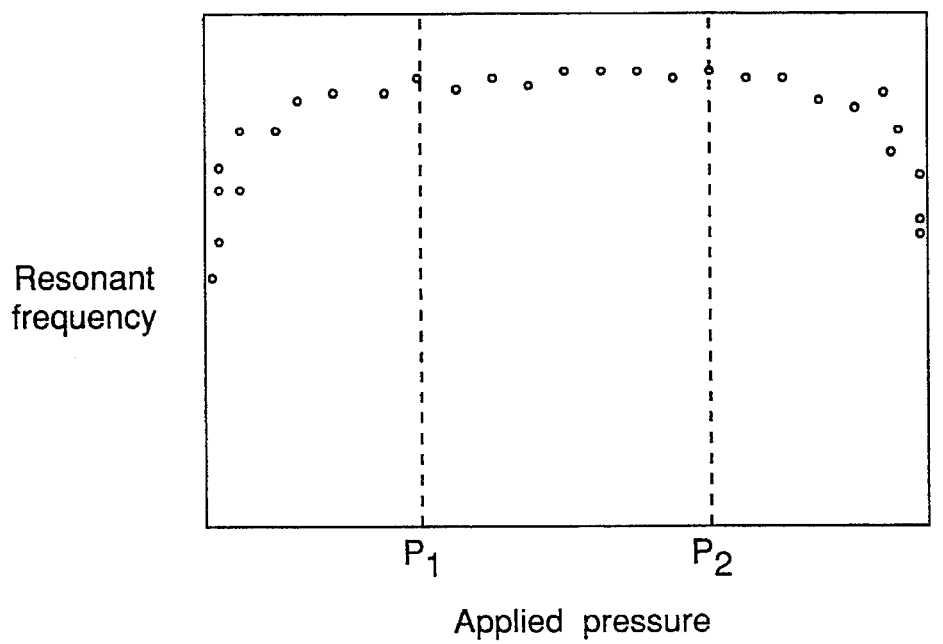
FIG. 3 is a graph of a characteristic of vibrant frequency plotted against applied pressure.
FIG. 4 is a graph of external impact force resistance plotted against roughness at surfaces of protrusions formed on a piezoelectric vibrator element.

Next, the effects of surface roughness of the protrusions are explained in a holding structure of a piezoelectric vibrator. When a piezoelectric plate is supported or fixed at the protrusions a force applied to the protrusions has to be kept within a certain range in order to keep the supporting or fixing conditions for the piezoelectric element constant. FIG. 3 shows a characteristic of vibrant frequency plotted against applied pressure when a piezoelectric plate is supported or fixed at protrusions formed with a spraying process on the piezoelectric plate. If the applied pressure is $P_1$ or lower, the supporting or fixing of the piezoelectric plate is unstable. The vibrant frequencies scatter greatly and the characteristic thereof are also unstable. On the other hand, if the applied pressure is $P_2$ or higher, losses due to the supporting or fixing become large and the characteristic of the piezoelectric plate becomes unstable again, or the piezoelectric plate is broken mechanically. It is needed to keep the applied force at the protrusions within a certain range, or between $P_1$ and $P_2$ so as to keep the supporting or fixing conditions roughly constant. The values of $P_1$ and $P_2$ vary with the material, size, vibration mode or the like of the piezoelectric plate or with the material, size, shape or the like of a holding means. It is desirable that an applied pressure is set at a lower value within the range in order to enhance the reliability of the piezoelectric plate.

The protrusions have the effect of setting an applied pressure at a lower value within the range. FIG. 4 shows durability against external impact force plotted against roughness at surfaces of protrusions formed on a piezoelectric plate. The piezoelectric plate is pressed at a value within the above-mentioned range of applied pressure for realizing stable characteristics. The ordinate represents an upper limit of an external impact force which does not affect the characteristics of the piezoelectric plate. If the roughness at the surfaces is less than 2 μm, an external impact force changes the supporting or fixing structure and affects the characteristics of the piezoelectric plate. On the contrary if the roughness is 2 μm or larger, the rough surface sticks into a holding member like wedges and the characteristics of the piezoelectric plate are not deteriorated if the external impact force becomes large. The value of the permissible limit of the external impact force varies with the material, size or the like of the protrusions or with the material, shape or the like of the holding member. The characteristics of the piezoelectric plate become stable if the roughness is 2 μm or larger, though the lower limit of the roughness depends a little on the applied pressure. Though the upper limit is not shown in FIG. 4, it is understood that the roughness does not exceed the width of a protrusion itself.

A spraying process is used for forming protrusions on a piezoelectric plate made of a piezoelectric material. After electrodes are formed on two principal planes of the piezoelectric plate, electrically conductive protrusions are formed on the electrodes at a node of vibrations of the piezoelectric plate. In an example of the spraying process, particles of sizes between 5 and 300 μm of a starting material are passed through a plasma at a high temperature so that they are melted. Then, the melted particles are blown along a gas stream to a piezoelectric plate for them to be deposited to form protrusions. The size of the particles of a starting material is selected appropriately according to the material, size and the like of the protrusions and the roughness at the surface, while the plasma temperature is determined according to the material of the protrusions, roughness at the surfaces, adhesion strength and the like. The conditions for forming protrusions are selected to satisfy following conditions. (1) Temperature increase of the piezoelectric plate caused by a spraying process is kept as low as possible. (2) The time needed for forming protrusions is kept short as is much as possible. (3) The mechanical strength of the protrusions is large. (4) The roughness at the surfaces of the protrusions are controlled. (5) The precision of the adhesion position of the protrusions is good and a fine pitch, if necessary, can be realized. Though a spraying process is used in the embodiment of the invention, other methods can be used if large melted particles can be deposited to form protrusions on the piezoelectric plate around a node of vibrations.

Metallic protrusions may be produced by plating in a vacuum deposition process or the like without heating in principle, but such protrusions may in practice have a height as low as several micrometers. If a piezoelectric vibrator is held by using such low protrusions, the piezoelectric vibrator is liable to make contact with the holders and deteriorate the vibration characteristics. If protrusions are produced by printing an organic material such as an electrically conductive paint it is also difficult to produce high protrusions. Further, such protrusions have weak mechanical strength adhesion strength. Therefore, they are not suitable for holding a piezoelectric vibrator. The spraying process used in the embodiments does not have such disadvantages of a vacuum deposition process or an electrically conductive paint.

Because electrically conductive protrusions are formed at or near a node of vibrations of a piezoelectric plate and the piezoelectric plate is held at the protrusions, a contact area between the piezoelectric plate and a member for holding the piezoelectric plate is determined as the top area of the protrusions. The contact area can be controlled so as to have a prescribed value. Therefore, the area needed for holding a piezoelectric vibrator can be increased as much as possible by considering the effects on the characteristics of the piezoelectric vibrator. Even if the means for holding the piezoelectric plate is displaced somewhat relative to the piezoelectric plate, the holding position is constant as to the piezoelectric plate. Therefore, the deterioration of the characteristics of the piezoelectric plate can be decreased while the stability and reliability of the characteristics of the piezoelectric plate can be improved. Because the protrusions also act as electrical leads, the holding structure of piezoelectric vibrator can be made simpler.

Embodiment 1

Figure 5:
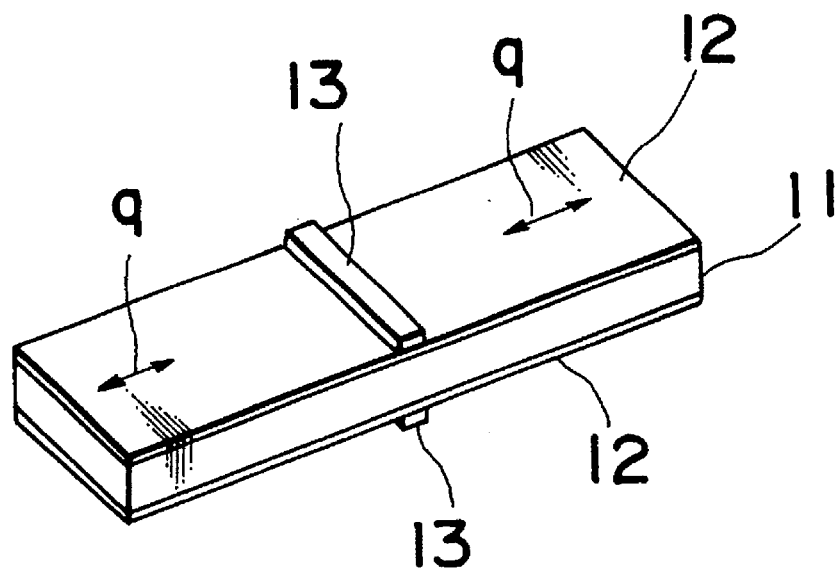
FIG. 5 is a perspective view of a piezoelectric vibrator element of a first embodiment of the invention.

FIG. 5 shows a holding structure of a piezoelectric vibrator of a first embodiment of the invention. A piezoelectric plate 11 is a rectangular plate of 4.4 mm length, 1.4 mm width and 0.5 mm thickness and it is made of a piezoelectric material such as a piezoelectric ceramic, quartz or lithium niobate. Electrodes 12 for driving the piezoelectric plate are formed on two opposing principal planes of the piezoelectric plate 11. When an alternating electric voltage is applied to the electrodes 12, longitudinal vibrations having a main displacement along a longitudinal direction of the piezoelectric plate 11 are generated as displayed with double arrows "q" in FIG. 5. The resonant frequency of the vibrator is 455 kHz.

A node line of the longitudinal vibrations is linear at a center of the rectangular plate 11. Protrusions 13 made from an electrically conductive material such as a metal or a ceramic are formed along the node line linearly with a spraying process. They have a 1.4 mm length, a 0.2 mm width and thickness between 50 and 70 μm. The roughness at the surfaces of the protrusions is 5–10 μm. In the spraying process, minute particles of a metal, a ceramic or the like are melted and pass through a plasma at a high temperature, and the melted minute particles are blown with a gas stream onto a base to form a film of the particles. Therefore, a film as thick as 5–10 μm can be formed on the substrate easily at a fast deposition rate.

Because a film formed by a spraying process (called a "sprayed film") is formed by continuous deposition of minute particles at high temperatures, the adhesion strength between particles included in the film is strong. Further, though each particle to be deposited is melted at a high temperature, the heat capacity of the particle is small, and the particles are blown to the substrate along a gas stream. Therefore, it is a feature that the temperature increase of the piezoelectric plate is very small as compared with a technique such as soldering or welding.

The width and the thickness of the protrusions 13 are suitably determined by considering stable holding of the piezoelectric plate 11 and an effect on the characteristics of the piezoelectric plate 11 by taking the vibration resistance and shock resistance into account. It is desirable that the width and the thickness of the protrusions 13 are to some extent large in order to hold the piezoelectric plate 11 stably, while the width thereof is desired to be smaller because the effect on the characteristics of the piezoelectric plate. Then, the width and the thickness of the protrusions 13 are appropriately determined by considering the two requirements to some extent.

It is to be noted that the protrusions are formed by a spraying process in the embodiment. The protrusion can then be stuck to the piezoelectric plate 11 at a sufficient adhesion strength without heating the piezoelectric plate 11 as in a welding process. The temperature of the plate increases actually to a temperature sufficiently lower than about 130° C., which begins to cause characteristic deterioration. Therefore, the temperature increase on forming the protrusions 13 is sufficiently lower as compared the prior art soldering technique, and effects on the characteristics of the piezoelectric plate are hardly recognized. Further, the protrusions can be easily formed as thick as 100 μm or more. Because the film can be formed so thick, the piezoelectric plate is not likely to contact a holding means even if it is inclined to some extent. Then the characteristics of the piezoelectric plate can also be kept stable from this aspect.

It is required that the protrusion 13 be mechanically stable when a holding force is applied and that the protrusion 13 has a stable electrical characteristic because it plays the role of an electrical lead for applying a driving voltage. Then, a material of the protrusion 13 can be appropriately determined appropriately by taking into account corrosion resistance, electrical conductance, elastic constant (hardness) and the like. The protrusion 13 is made from a material such as a metallic material such as a nickel-chromium alloy, a stainless steel alloy, molybdenum, brass, silver, a copper alloy or an aluminum alloy, or an electrically conductive ceramic.

Figure 6:
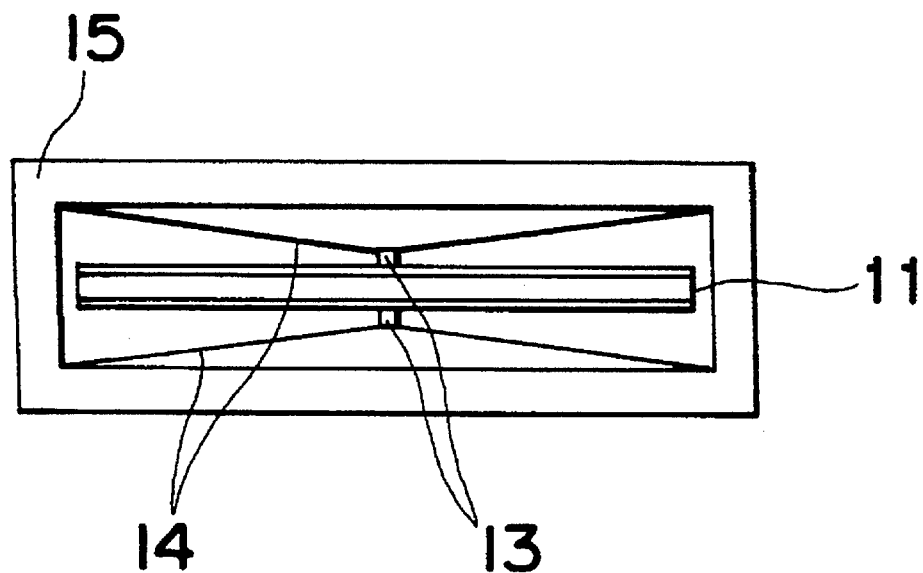
FIG. 6 is a sectional view of a holding structure for the piezoelectric vibrator shown in FIG. 5.

FIG. 6 is a sectional view along a longitudinal direction of an embodiment of a the holding structure for a piezoelectric plate 11 shown in FIG. 5. The piezoelectric plate 11 is held above and below at protrusions 13 formed at the center thereof with a spraying process by holders 14 having elastic properties, and it is contained in a case 15. The elastic properties of the holders 14 are useful in order to hold the piezoelectric plate 11 at a constant applied pressure and to buffer external shocks or the like to prevent the propagation of external forces from the case 15 to the piezoelectric plate 11.

The holder 14 in the embodiment is a leaf spring made of a spring material such as phosphor bronze or stainless steel. A leaf spring is provided having a length suitably longer than the length of the inner space in the case 15, and as shown in FIG. 6, two ends thereof are set at two ends of the inner Space so as for the leaf spring to be bent like an arch. The leaf spring has a 1.4 mm width and a 100 μm thickness. A force applied to the piezoelectric plate from above and below can be set at an appropriate value of 150–200 gf by appropriately designing the elastic constants and the size, such as thickness and length.

The protrusions 13 formed by a spraying process have a sufficient adhesion strength to the piezoelectric plate 11, They also have a sufficient mechanical strength so as to hardly causes elastic deformation when it is held by the holding members 14. Thus, the piezoelectric plate 11 can be held at the protrusions 13 so that it has good and reliable characteristics with little scattering.

If the leaf springs are made from an electrically conducting material such as a metallic thin plate, an electrical voltage can be applied to the piezoelectric plate 11 through the leaf springs. The piezoelectric vibrator is used as a component of an oscillator, a ceramic filter or the like. An alternating voltage is applied to the electrodes 12 of the piezoelectric plate 11 through electrically conducting holding members 14, or through a supply means such as electrical leads formed on the holding members 14 and then through the protrusions 13.

Figure 7:
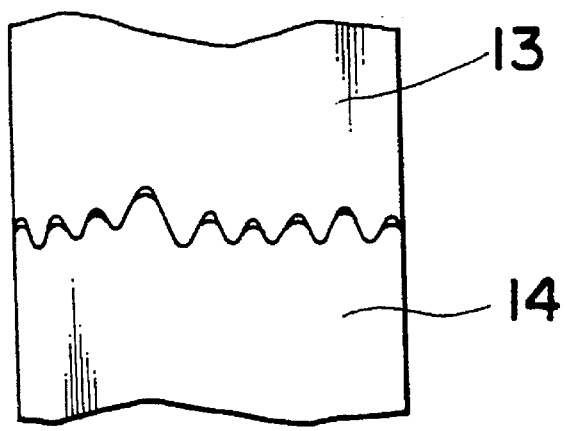
FIG. 7 is a partial view of a protrusion and a holding member.

Preferably, the protrusions 13 are made from a relatively hard metallic material such as a nickel-chromium alloy, a nickel-chromium-aluminum alloy or molybdenum or an electrically conductive ceramic material. The protrusions are formed to have minute roughness of a few to a few hundreds micrometers, preferably from a few tens to a few hundreds micrometers, at the surfaces thereof. Further, the holding members 14 are made from a material such as brass, a copper alloy, and an aluminum alloy having a hardness smaller than the protrusions 13. In a contact state formed in such a condition of the protrusion 13 with a holding member 14 as shown in FIG. 7, the minute roughness at the surface of the protrusion 13 sticks into the surface of the holding member 14. This mechanical bonding realizes a stable holding of the piezoelectric plate 11 to reduce the effects of vibrations and shocks well. Further, an adhesion area of a protrusion 13 to the piezoelectric plate 11 can be reduced to an extent that the mechanical bonding between the piezoelectric plate 11 and the protrusion 13 is enhanced. This improves the characteristics of the piezoelectric plate 11.

Figure 8:
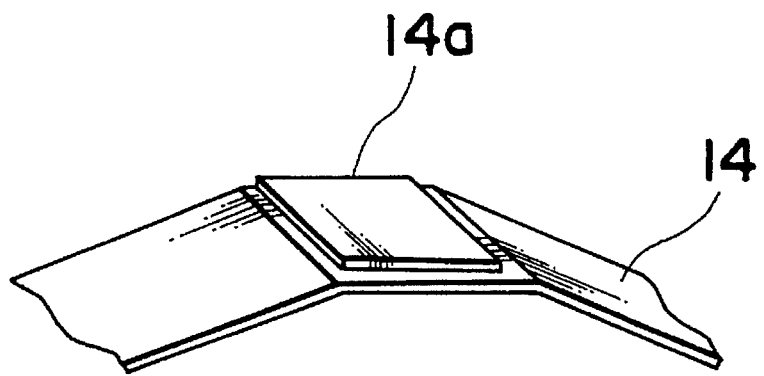
FIG. 8 is a partial perspective view of a holding member.

In the example described above, the leaf spring as a holding member of the piezoelectric plate is made from a material having a relatively low hardness such as brass, a copper alloy or an aluminum alloy. A similar advantage can be realized in a modified example shown in FIG. 8. In the example, the leaf spring is made from a material having a relatively high hardness such as a stainless steel or a spring steel, while an electrically conductive film 14a is formed on a contact portion of a holding member 14 by using a material having a hardness lower than the leaf spring such as brass, a copper alloy, an aluminum alloy, a lead alloy or a solder. Then, the roughness at the surface of the protrusion sticks into the electrically conductive film 14a.

An alternating voltage is applied to electrodes of the piezoelectric plate through the electrically conductive protrusions without using leads connected to the electrodes. The electrical conduction between the protrusions 13 to an electrical supplier provided externally is performed through the holder 14 made of an electrically conduction material or through an electrically conducting path formed along the holder 14.

In the example explained above, the protrusion is formed on an electrode for driving a piezoelectric plate. However, the electrode may be formed after the protrusion is formed on the piezoelectric plate.

Figure 9A:
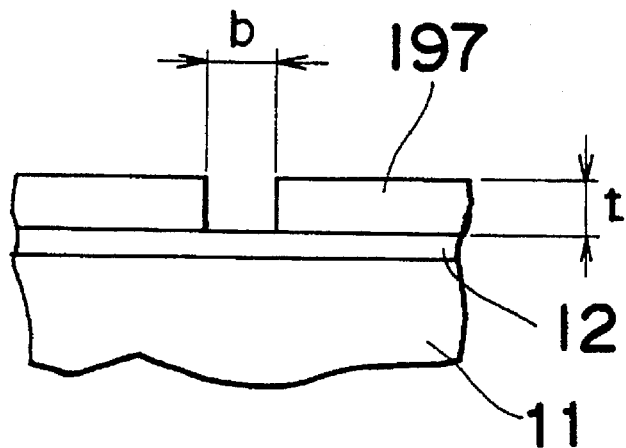
FIGS. 9A, 9B and 9C are sectional views of steps for illustrating an example of a manufacturing method of the holding structure of a piezoelectric vibrator.

Next, an example of a method for forming the protrusions 13 shown in FIG. 5 is explained with reference to FIGS. 9A–9C. As shown in FIG. 9A, an electrode 12 is formed on a piezoelectric plate 11, and an organic resist mask 197 is formed on the electrode 12 with screening printing. The resist mask has an opening of width "b" and height "t". The resist mask 197 is made of an organic material because a sprayed film formed with a spraying process has a tendency to be hard to adhere to a relatively soft material such as an organic material. Secondly, the resist mask 197 can be separated and removed completely with an etchant or the like without damaging the electrode 12 and a protrusion 13.

Figure 9B:
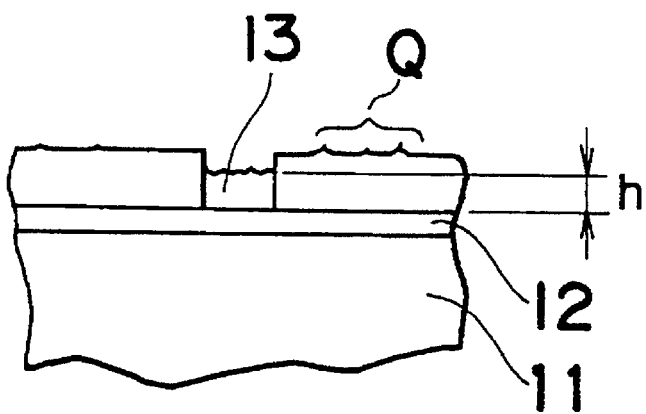

Next, as shown in FIG. 9B, the protrusion 13 is formed as a sprayed film in the opening formed in the resist mask 197 at a node from above with a spraying process. The sprayed film has a height "h" equal to or lower than the thickness "t" of the resist mask 197. The sprayed film hardly adheres to the resist mask 197, and sprayed particles only adhere sparsely, as shown schematically in a section Q in FIG. 9B. Therefore, the sprayed film is deposited only in the opening.

Figure 9C:
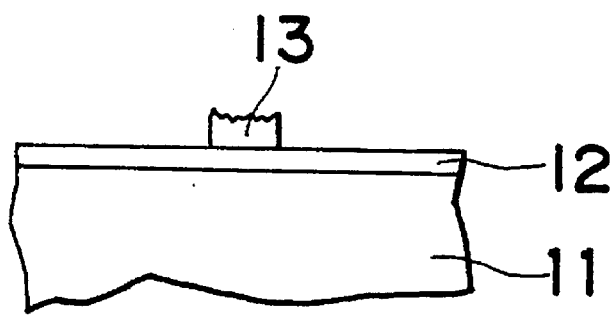

Finally, as shown in FIG. 9C, the resist mask 197 is removed with a resist etchant. The resist mask 197 is removed completely, and the sprayed film remains as the protrusion 13. The protrusion 13 has a shape with definite sides or has a shape similar to that of the opening. That is, the protrusion 13 can be formed to have almost same width at upper and lower portions. The protrusion 13 has a flat top surface, though it has minute roughness. Therefore, the piezoelectric plate 11 can be held not inclined against the holding member holding it. It is also an advantage that the resist mask can be formed at a low cost.

Next, a modified example is explained wherein a protrusion 13 has a width "a" at an upper side smaller than "b" at a lower side. Such a protrusion is needed according to the following reasons. First, the width or area of the protrusion at the bottom is preferably as narrow as possible in order to decrease the effects on the vibrations of the piezoelectric plate. Second, the width or area of the protrusion at the top is preferably as wide as possible in order to prevent the piezoelectric plate from being inclined to make contact with the external electrode or the like.

Figure 10A:
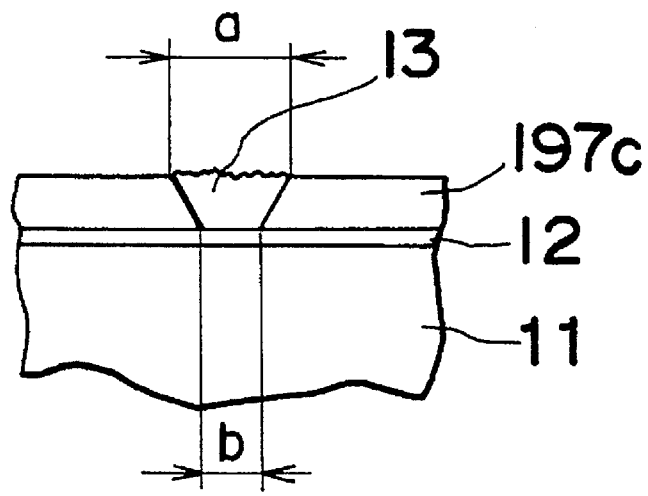
FIGS. 10A, 10B and 10C are sectional views of other examples of forming sprayed films.
Figure 10B:
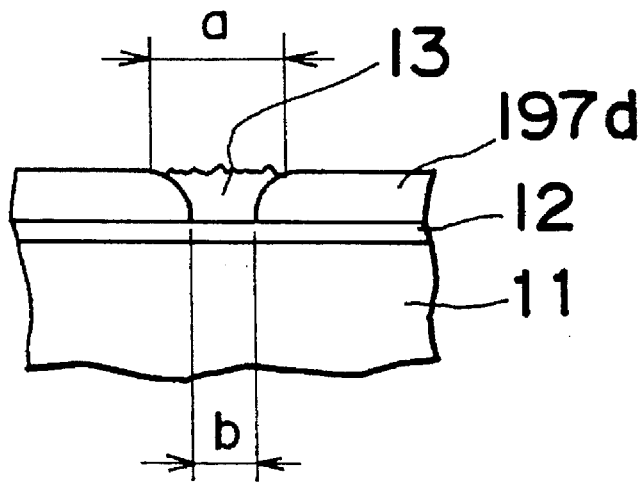
Figure 10C:
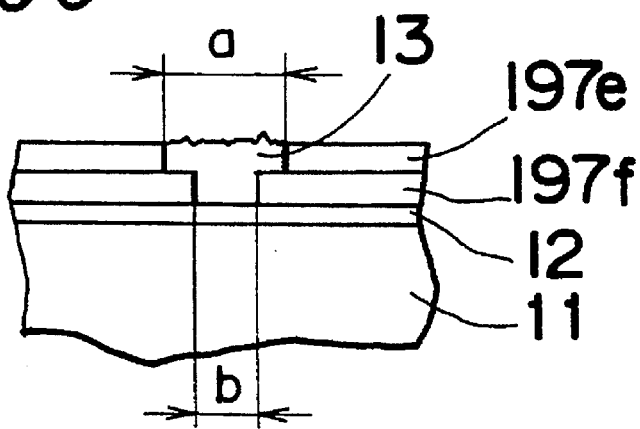

FIGS. 10A–10C show a step of three examples of a method of forming such a protrusion, in correspondence the step shown in FIG. 9B explained above. In the three examples, an electrode 12 is formed on a piezoelectric plate 11, and an organic resist mask is formed on the electrode 12 with screening printing. The resist mask has an opening having a width "a" at the top-wider than "b" at the bottom. However, the shape of the opening is different among the three examples. In a first example shown in FIG. 10A, the slope of the opening formed in the resist mask 197c is constant. In a second example shown in FIG. 10B, a resist mask 197d has an opening having a slope decreasing gradually up to the top. In a third example, a resist mask is composed of two layers 197e and 197f, and the size of the opening is different in the two layers. After the opening is formed, a sprayed film is deposited by a spraying process in the opening to form a protrusion 13.

Figure 11A:
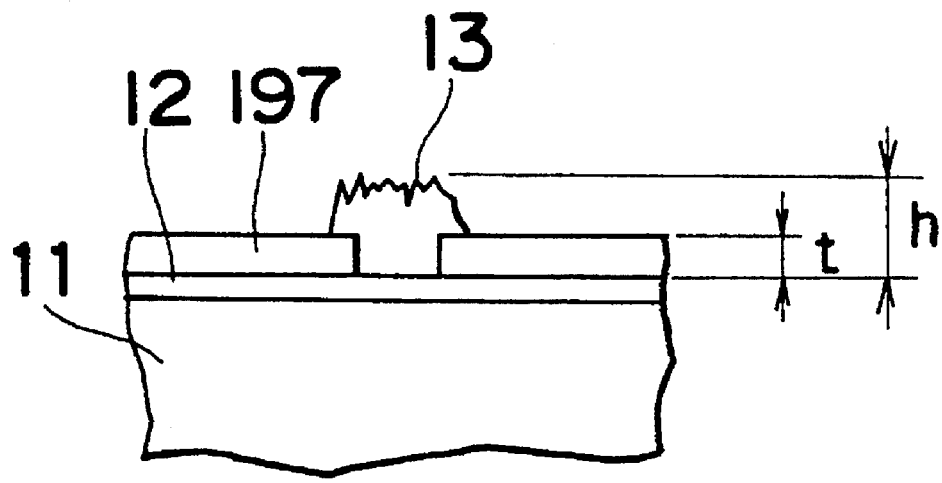
FIG. 11A and 11B are sectional views of steps of a different method of forming a sprayed film.
Figure 11B:
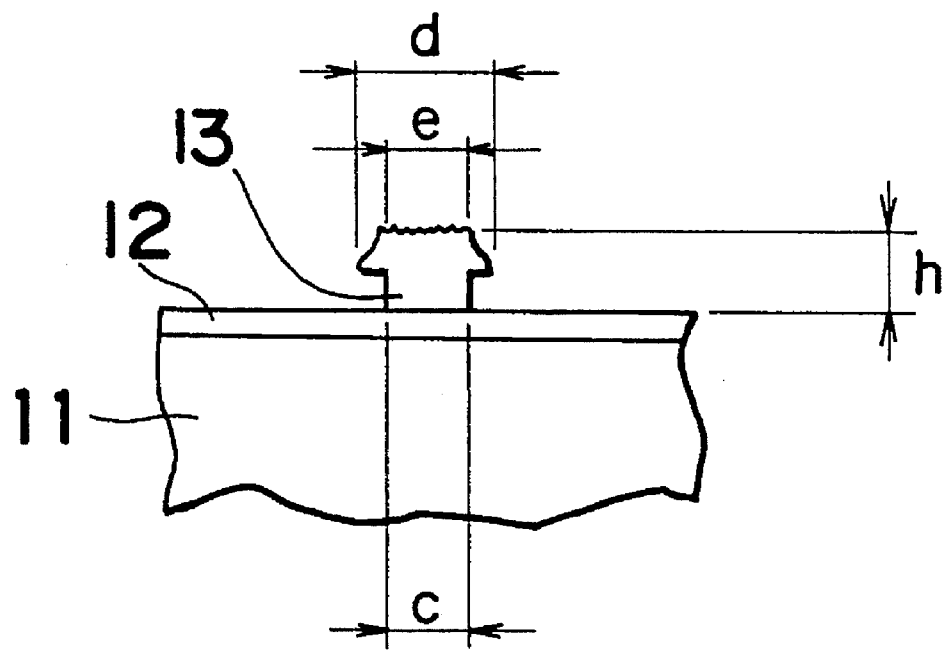

FIGS. 11A and 11B show steps of a modified example of a method of forming a protrusion 13 having a wider portion at the top. As shown in FIG. 11A, a sprayed film is deposited over the top of the opening formed in the resist mask 197. That is, the height "h" of the sprayed film or a protrusion 13 is higher than the thickness "t" of the resist mask 197, in contrast to FIG. 9B. Then, the protrusion 13 made of a sprayed film flows over the opening to have the height "h" larger than "t" as mentioned above and simultaneously to extend to a width "d" wider than the width "c" of the opening. The top of the protrusion 13 has a width "e" larger than "c". Because the sprayed film is hard to be adhered to the resist mask 197, the size "d" does not increase greatly, but is suppressed to an appropriate extension. Thus, a protrusion having a larger width at the top and a smaller width at the bottom can be produced. Then, the resist mask 197 is removed with an etchant, as shown in FIG. 11B, to form the protrusion 13 having a wider width at the top on the piezoelectric plate 11. The resist ink used in the examples is a resist X87 of Taiyo Inki Seizo KK. The resist is selected according to the width of the opening, the resist thickness, the resistance against heat and the like by considering that a sprayed film is hard to be adhered, that the resist film can be removed completely without causing damage to the electrodes 2, the protrusions 3 and the like and that the width and the thickness of the opening can be controlled to have desired values.

The resist mask may be made of a dry film or a photoresist. In this case, a pattern of an opening is formed with a photolithography process or the like.

Figure 12A:
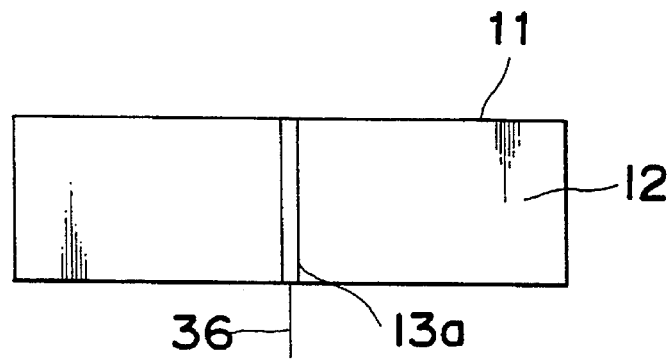
FIGS. 12A and 12B are top and bottom views of a piezoelectric vibrator with protrusions of different widths.
Figure 12B:
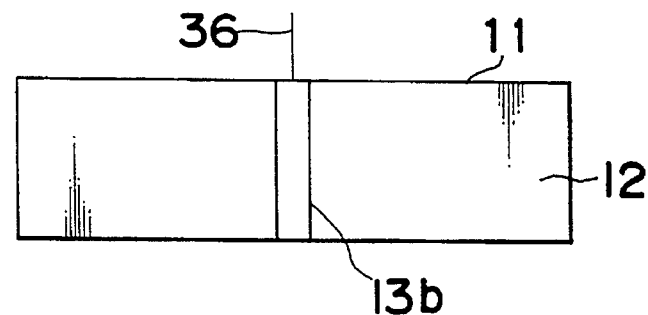

The sizes such as the width of two protrusions 13a and 13b formed on opposing principal planes of a piezoelectric plate 11 may be different from each other as shown in FIGS. 12A and 12B, wherein reference numeral 36 denotes the position of a node line. In this example, the two protrusions 13a and 13b have widths different from each other. Then, the piezoelectric plate 11 can be held stably with protrusions of a smaller area than a holding structure using protrusions with the same width.

The protrusions 13a and 13b extend along the whole width of the piezoelectric plate 11. However, even if they are formed along a part of the whole width thereof, similar effects can be realized.

Figure 13A:
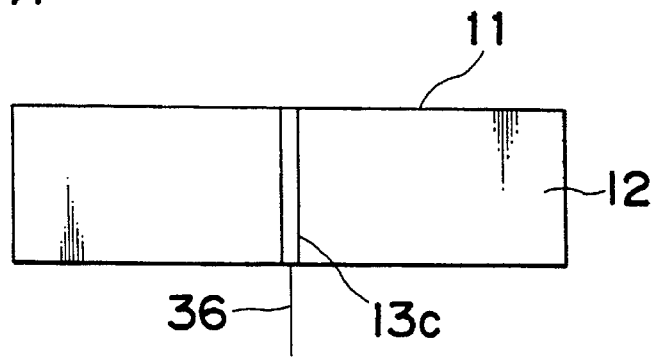
FIGS. 13A and 13B are top and bottom views of a piezoelectric vibrator with three protrusions.
Figure 13B:
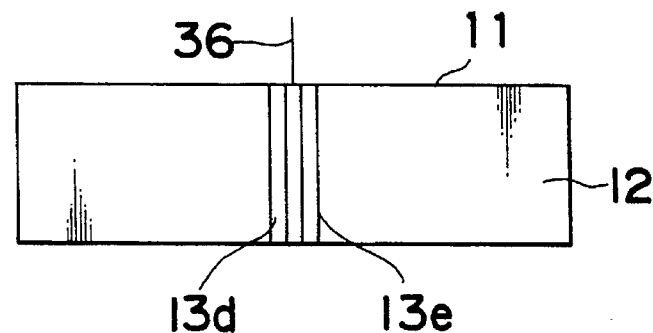

The number of protrusions 13 is not limited to two. FIGS. 13A and 13B show an example wherein three protrusions 13c, 13d and 13e are formed on two principal planes of the piezoelectric plate 11. One protrusion 13c is formed on a principal plane along a node line as shown in FIG. 13A, while two protrusions 13d and 13e are formed on the other principal plane near the node line. In this example, the piezoelectric plate 11 can be held stably with protrusions of a smaller area than a holding structure using two protrusions in order to have less effect on the characteristics of the piezoelectric plate.

Embodiment 2

Figure 14:
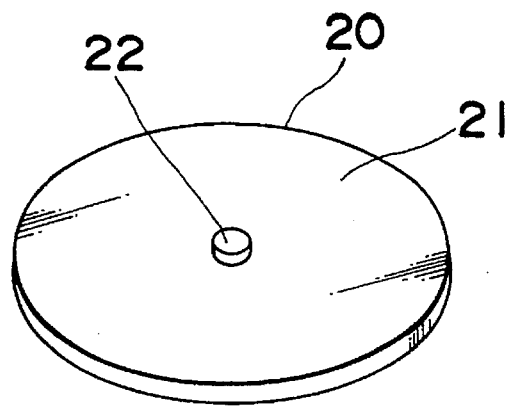
FIG. 14 is a perspective view of a disk-like piezoelectric vibrator.

FIG. 14 shows a disk-like piezoelectric vibrator of a second embodiment of the invention. Electrodes 21 are formed on two opposing principal planes of a disk-like piezoelectric plate 20, and when an alternating voltage is applied to the electrodes 21, extensional vibration modes having a main displacement along radial directions can be generated in the disk-like piezoelectric plate 20.

A node of the vibrations is located at a center point of the disk-like piezoelectric plate, and electrically conductive protrusions 22 made of a metal or a ceramic are formed on the two electrodes 21 at the node point by a spraying process. A contact area of the protrusion 22 with the piezoelectric plate 20 is determined so as to hold the piezoelectric plate stably against vibrations and shocks and to have small effects on the characteristics of the piezoelectric plate 20. Generally, the area is 1/60–1/20 of the area of the piezoelectric plate 20.

Figure 15:
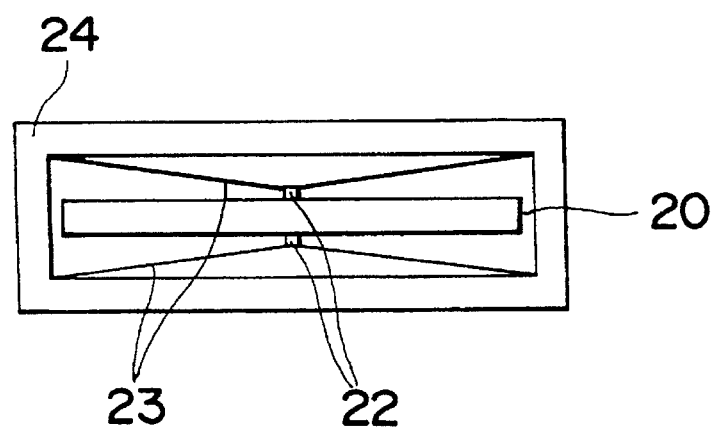
FIG. 15 is a sectional view of a holding structure for the piezoelectric vibrator shown in FIGS. 12A and 12B.

FIG. 15 shows a holding structure of the piezoelectric plate 20. The piezoelectric plate 20 is held above and below at protrusions 22 formed at the center thereof by a spraying process, by holding members 23 having elastic properties, and it is contained in a case 24. The elastic properties of the holding members 23 are useful in order to hold the piezoelectric vibrator 20 at a constant applied pressure and to buffer external shocks and the like to prevent the propagation of external forces from the case 24 to the piezoelectric plate 20.

A piezoelectric vibrator of a square-like shape also may have a point node. In such a case, point-like protrusions are formed similarly to the above-mentioned case.

In the first and second embodiments explained above because electrically conductive protrusions are formed around nodes of vibrations of the piezoelectric plate by a spraying process, mechanical quality factors $Q_m$ and coupling factors of the piezoelectric plate remain large and the protrusions are strong mechanically. The contact area between the piezoelectric plate and the holding member is determined by a top area of the protrusion, and it is kept almost constant. Therefore, the area needed for holding the piezoelectric plate can be increased by considering the effects on the characteristics of the piezoelectric plate. Further, because the protrusions are formed on the piezoelectric vibrator even if the holding member is displaced relative to the piezoelectric vibrator, the holding position is kept at the same position for the piezoelectric vibrator. Then, the characteristic of the piezoelectric vibrator remains constant and the piezoelectric vibrator can be held reliably and stably. Still further, because the protrusions also act as electrical leads for supplying an electrical voltage to the piezoelectric plate, an oscillator, a ceramic filter or the like can be constructed easily.

Embodiment 3

Figure 16A:
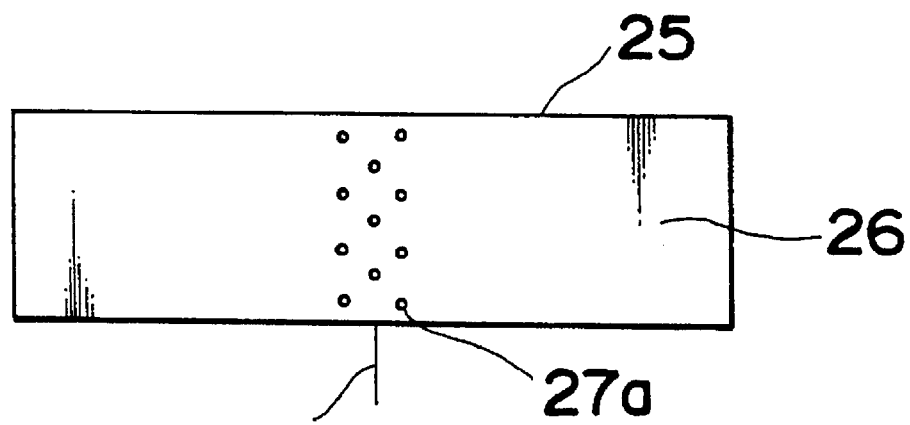
FIGS. 16A and 16B are a top view and a bottom view of an example of a piezoelectric vibrator of a rectangular plate of a third embodiment of the invention.
Figure 16B:
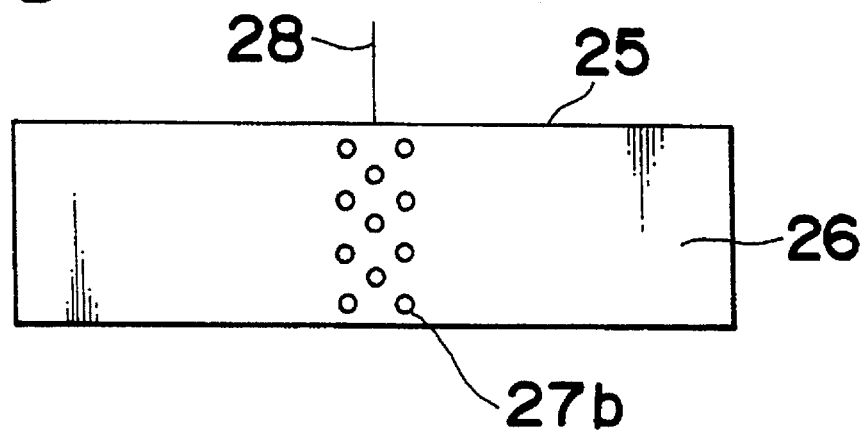

FIGS. 16A and 16B show a piezoelectric vibrator of a third embodiment of the invention, including a piezoelectric plate 25 of a rectangular plate made of a piezoelectric material such as a piezoelectric ceramic, quartz or lithium niobate. Electrodes 26 for driving the piezoelectric plate are formed on two opposing principal planes of the piezoelectric plate 25. When an alternating electric voltage is applied to electrodes 26, longitudinal vibrations having principal displacement along a longitudinal direction of the piezoelectric plate 25 are generated. A node of vibrations of the longitudinal vibrations is linear at the center of the piezoelectric plate 25. As shown in FIG. 16A, point-like protrusions 27a made from a nickel alloy, a nickel-chromium alloy, molybdenum or the like are formed around the node designated with reference number 28 by a photolithography process and a spraying process. They are aligned in three rows, and each of them have a certain area. As shown in FIG. 16B, protrusions 27b are formed similarly around the node on the opposite principal plane of the piezoelectric vibrator 25, and they have areas larger than those of the protrusions 27a.

Similarly to embodiments 1 and 2, the piezoelectric plate 25 is held from above and below at the protrusions 27a, 27b by using holding members having elastic properties and it is contained in a case, By controlling the size of the protrusions 27a, 27b provided on the two principal planes, the piezoelectric plate 25 can be held stably with smaller contact areas as compared with a piezoelectric plate having protrusions with same sizes, Thus, the piezoelectric plate can be held more stably and more reliably and have little effect on the characteristics of the piezoelectric plate.

In the example shown in FIGS. 16A and 16B, the protrusions have a circular shape at the top thereof. However, a different shape such as a triangle, a square or a ring also act similarly for holding the piezoelectric plate with the holding members. It is also to be noted that protrusions formed on a piezoelectric plate having a contour other than a rectangle, such as a square shape or a circular shape or using extensional vibrations, also operate similarly. Though the example uses a rectangular piezoelectric plate, it is understood that protrusions can also be formed on a piezoelectric plate of a shape other than a rectangle such as a square or a circle, and similar advantages can be realized on the characteristics of the piezoelectric plate.

Embodiment 4

Figure 17A:
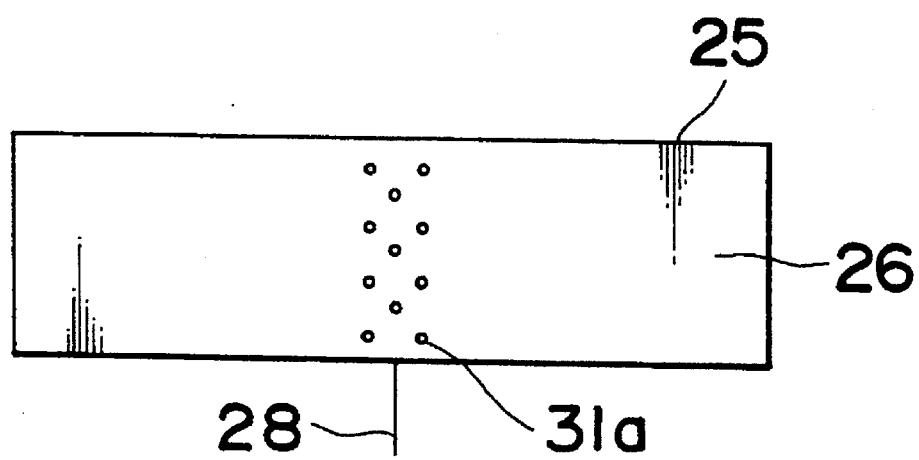
FIGS. 17A and 17B are a top view and a bottom view of a piezoelectric vibrator of a rectangular plate of another example of the third embodiment.
Figure 17B:
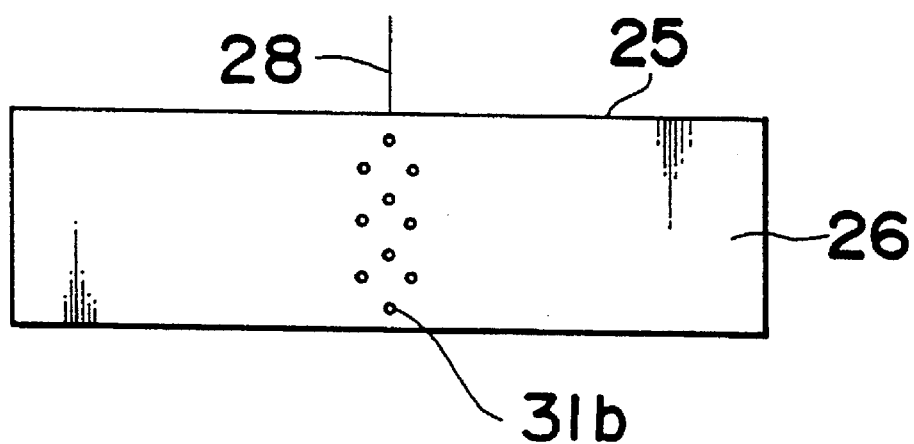

FIGS. 17A and 17B show a piezoelectric plate 25 of a rectangular plate of a fourth embodiment. This embodiment is same as the third embodiment, except that the arrangement of protrusions 31a formed on electrodes 26 applied to a principal plane of the piezoelectric plate 25 are different from that of protrusions 31b formed on the other principal plane. That is, the positions of the protrusions 31b are set so as not to coincide with those of the counterpart protrusions 31a.

Similarly to the third example, the protrusions may have a different shape, other than a circle, such as a triangle, a square or a ring, but will also act similarly for the holding of the piezoelectric vibrator with the holding members. It is also to be noted that protrusions formed on a piezoelectric vibrator having a contour other than a rectangle, such as a square shape or a circular shaper or using extensional vibrations, also act similarly.

Embodiment 5

Figure 18:
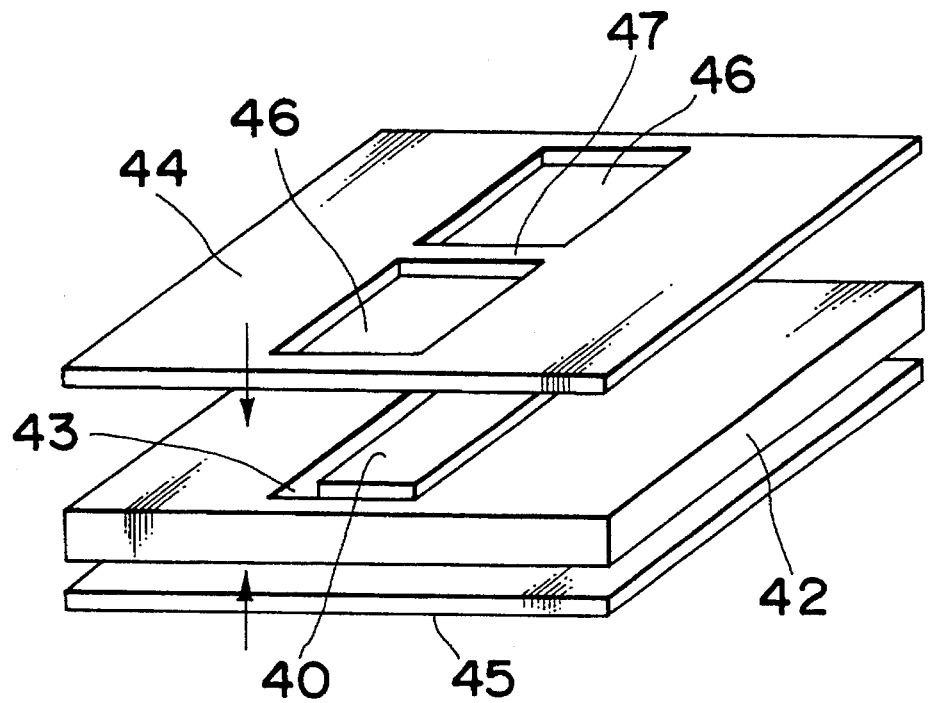
FIG. 18 is a perspective view of a fifth embodiment of the invention.

FIG. 18 shows a perspective view of a holding structure of a piezoelectric vibrator of a fifth embodiment. A reference numeral 40 denotes a piezoelectric plate of a rectangular shape as shown in FIG. 5 The piezoelectric element 40 has two linear protrusions 13 formed on the two principal planes thereof. A spacer 42 is made of a plate of a plastic material or the like and it has a large opening 43 having a size somewhat larger than the periphery of the piezoelectric plate 40. The piezoelectric element 40 can be placed easily by inserting it in the opening 43 of the spacer 42 without contact therewith. Then, the piezoelectric element 40 is interposed between two printed circuit boards 44 and 45 with a certain force as shown by arrows in FIG. 18. The boards 44, 45 also have openings 46 in correspondence to the opening 43, but they have a bridge portion 47 in correspondence to the linear protrusions 13. For electrical conduction through the protrusions 13, electrode patterns of copper foils 48, 49 are provided on the bridge portion 47 in planes to make contact with the protrusions 13.

Figure 19:
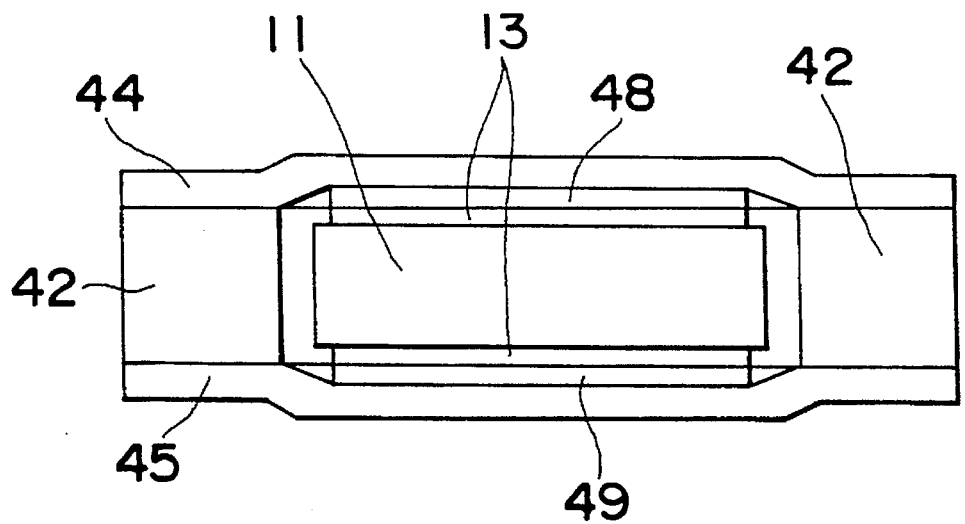
FIG. 19 is a sectional view of holding structure shown in FIG. 18 in a width direction along a bridge portion.

FIG. 19 shows a section of the holding structure shown in FIG. 18 in the width direction along the bridge portions 47. It is shown that the piezoelectric plate 11 is held at the protrusions 13 by the printed circuit boards 44 and 45. The thickness of the spacer 43 is determined so as to hold the piezoelectric element 40 with an appropriate force by taking into account the flexural rigidity and flexure quantity of the printed circuit boards 44, 45. Electrodes for driving the piezoelectric plate 11 are connected to the copper foils 48, 49. Though the example uses a rectangular piezoelectric plate, it is understood that a similar holding structure can also be used for a piezoelectric plate of a shape other than a rectangle, such as a square or a circle for extensional vibrations or bending vibrations, and results in similar advantages on the characteristics of the piezoelectric plate.

As explained above, the shape of the holding structure of the fifth embodiment is designed to hold the piezoelectric plate stable at the protrusions. However, it is possible to hold the piezoelectric plate only by using the copper foils 48, 49 stably without forming openings in the printed circuit boards 44, 45.

Embodiment 6

Figure 20:
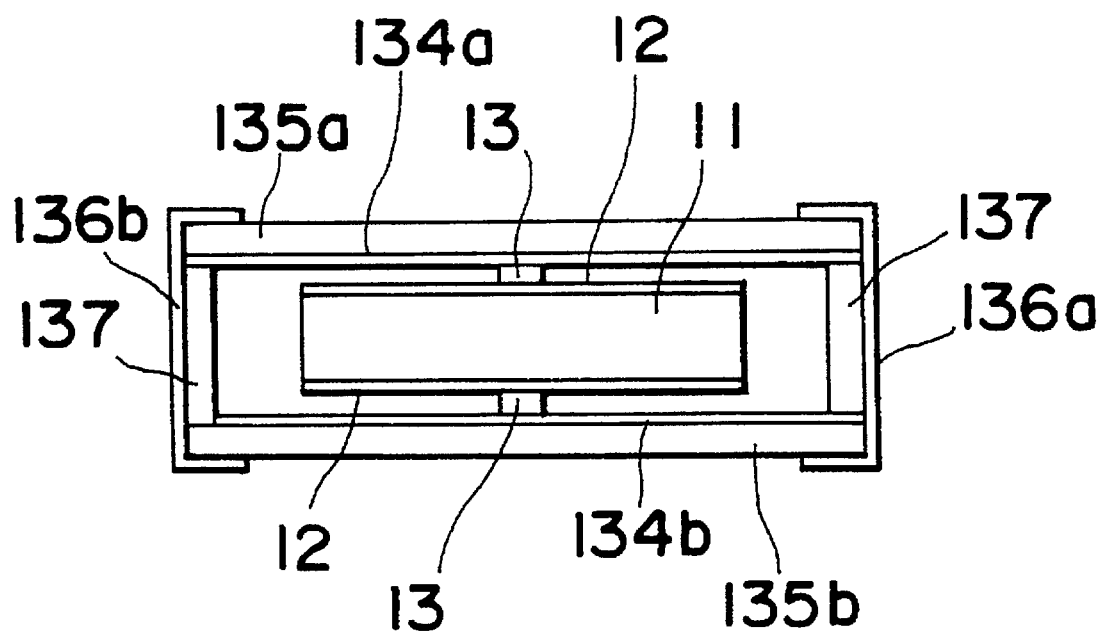
FIG. 20 is a sectional view of a holding structure in a longitudinal direction.

FIG. 20 shows a perspective view of a holding structure of a piezoelectric plate as shown in FIG. 5. Suffixes "a" and "b" of reference numerals denote top side and bottom side, respectively. External electrodes 134a and 134b are formed on holding plates 135a and 135b, and the two protrusions 13 are contacted with and interposed by the two external electrodes 134a, 134b or by the two rectangular holding plates 135a, 135b. The plates 135a, 135b are fixed with a frame 137 provided at the periphery of the plates 135a, 135b. External terminals 136a and 136b are formed on two sides of the periphery of the frame 137 as shown in FIG. 20 and make contact electrically with the external electrodes 134a and 134b, respectively.

Figure 21:
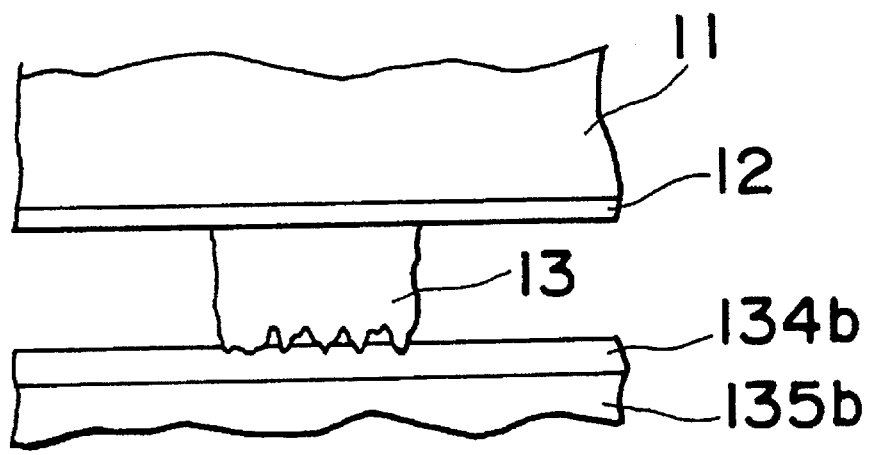
FIG. 21 is a partial view of the holding structure around a protrusion.

FIG. 21 shows a partial view of the holding structure around the protrusion 13. The bottom of the protrusion 13 adheres to the electrode 12, while the top thereof sticks into the external electrode 134b as schematically illustrated by the minute roughness in FIG. 21. Thus, the piezoelectric plate is held surely between the holding plates 135a, 135b, while the electrical conduction is maintained surely between the external electrodes 136a, 136b and the driving electrodes 12.

Figure 22A:
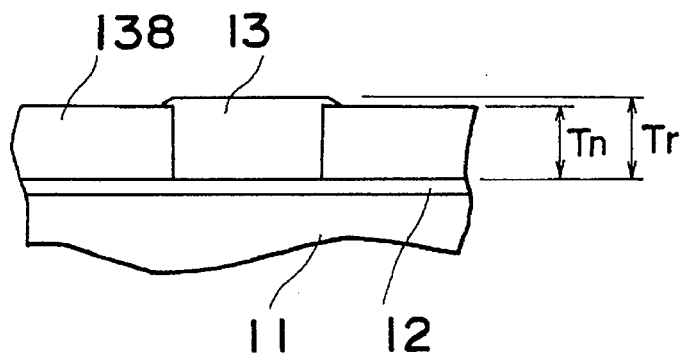
FIGS. 22A, 22B and 22C are sectional views of manufacturing steps of a holding structure of piezoelectric vibrator.

Next, a manufacturing method of the holding structure is explained with reference to FIGS. 22A–22C. As shown in FIG. 22A, a resist mask 138 for patterning a protrusion is formed first on a plane of a piezoelectric plate 11 on which an electrode 12 is formed for driving. The resist mask 138 has an opening patterned along a node of the piezoelectric plate 11. A film is formed in the opening with a spraying process by using a metal such as molybdenum, nickel or chromium or an alloy thereof or a composite material to form a protrusion 13. The protrusion 13 is formed on each of the principal planes of the piezoelectric plate 11.

Figure 22B:
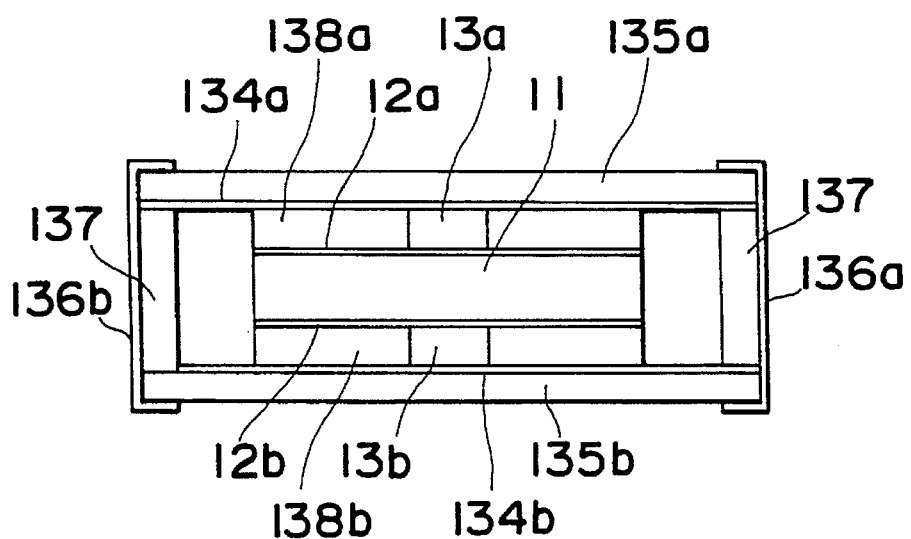
Figure 22C:
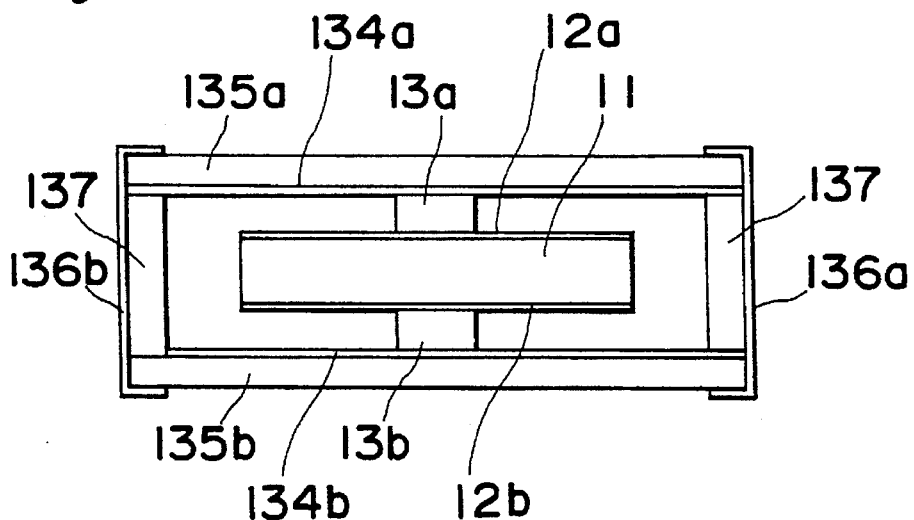

Next, as shown in FIG. 22B, a frame 137 is put on a holding plate 135b on which an external electrode 134b is formed, and on a prescribed position on the holding plate 135b as constructed above, a piezoelectric plate 11 is put via the protrusion 13 and the resist mask 138b. Then, another holding plate 135a with another external electrode 134a is placed thereon. Then, the holding plates 135a and 135b are fixed to a frame 137 with an adhesive agent or the like, while holding the piezoelectric plate in a prescribed position. In this state, because the resist masks 138 are formed on the piezoelectric plate 11, it does not contact with the external electrodes 134a, 134b directly even if they are inclined or displaced somewhat on fixing. Next, as shown in FIG. 22C, after constructing the piezoelectric plate 11 and the holding plates 135 as described above, the resist masks 138a, 138b are removed. Therefore, the piezoelectric plate 11 can be located and fixed at a normal position against the holding plates 135a, 135b, the frame 137 and the like.

Because the piezoelectric plate 11 is held by the holding plates 135a, 135b in the same state before removing the resist masks 138, it does not make contact with the external electrodes 134, the holding plates 135, the frame 137 or the like. Therefore, the characteristics of the piezoelectric vibrator is improved and the stability thereof is also improved. Further, the construction and the adjustment can be performed efficiently to improve the productivity of a holding structure of piezoelectric vibrator.

Next, the thickness $T_r$ of the resist masks 138 and the thickness $T_n$ of the protrusions 13 are explained with reference to FIG. 22A. In FIG. 22A, $T_r<T_n$. The difference between $T_r$ and $T_n$ is set to be about 5–30 μm. Then, in a state shown in FIG. 22B, there exists gaps between the external electrodes 134a, 134b and the resist masks 138a, 138b, and an etchant liquid for removing the resist masks 138a, 138b is likely to penetrate through the gaps to make it easy to release them. Further, because $T_r<T_n$, the protrusions 13 make contact with the external electrodes 134a, 134b surely.

The external electrodes 134 are made of copper having a hardness smaller than the protrusions 13, while the protrusions 133 has rough surfaces. Therefore, the roughness sticks into the external electrodes 134a, 134b, so that sure holding and sure electrical contact can be realized.

The resist masks 138 are made of a resist which can be patterned with a photolithography process and can be dissolved or softened and removed with a releasing liquid used exclusively therefor. For example, a dry film photoresist of α, AF00, BF type is available from Tokyo Oka Kogyo KK. It is needed to provide a gap sufficient to pass the liquid or the removed resist mask without being trapped caught by the holding plates 135, the frame 137 or the like. Therefore, the liquid is preferably a type which can dissolve the resist mask 138. For example, a liquid of PMER P-AR 9000 is available from the Tokyo Oka Kogyo KK. The resist mask 138 may be formed with screening printing. In this case, a soluble etching resist ink X-87 or M-85 of Taiyo Inki Seizo KK may be used.

A resist material is selected by considering following conditions. Corrosion, erosion or the like is not caused by a development agent or an etchant liquid on the piezoelectric plate 11, the driving electrodes 12, the external electrodes 134, the holding plates 135, the frame 137 or the like. A required thickness can be obtained easily. If a resist material is mainly made from an organic material and it satisfies the above-mentioned conditions, it can be used for forming the protrusions 13, in addition to the above-mentioned examples.

Figure 23A:
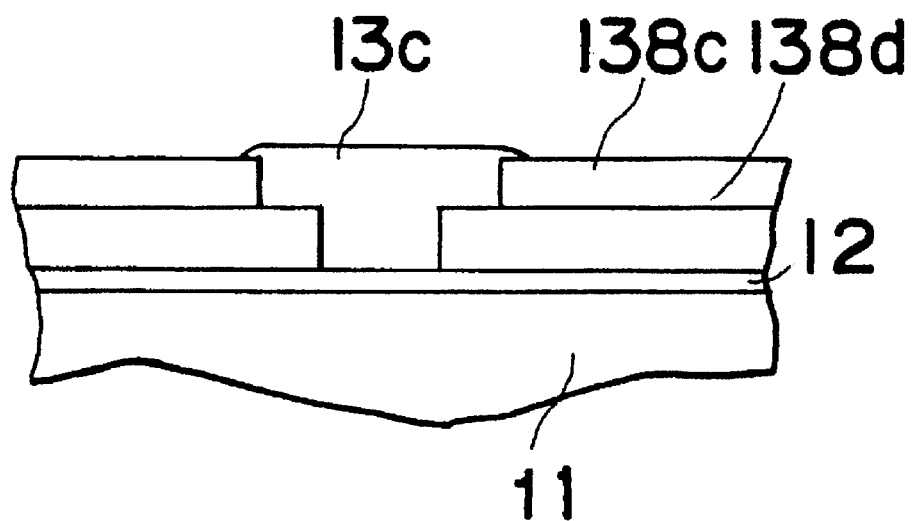
FIGS. 23A and 23B are sectional views of a multi-layer resist mask.
Figure 23B:
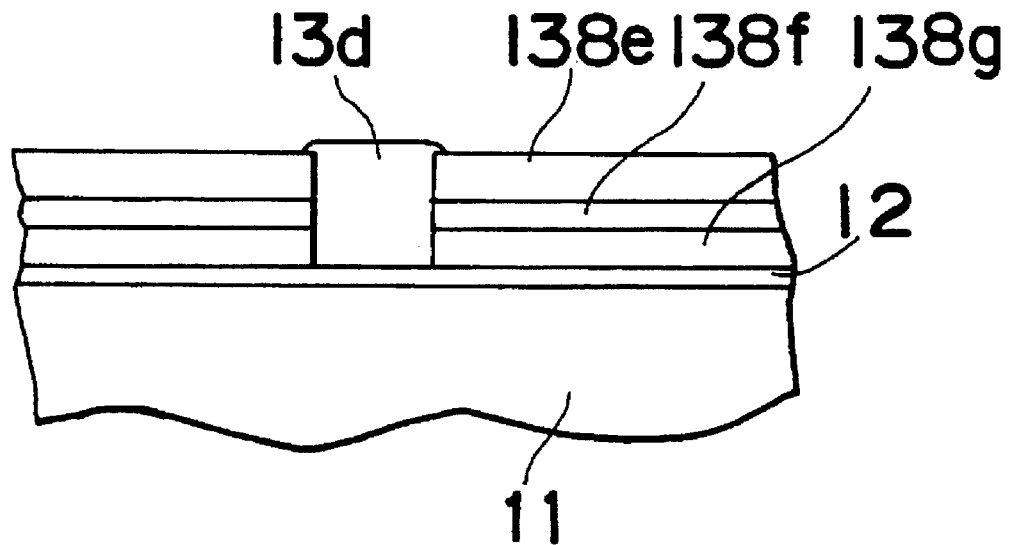

A resist mask of a thickness of 30 μm or more, in correspondence to the thickness of the protrusions 13, can be formed with a resist film. However, if an ink type resist is used, a resist mask can be made thick by providing a multi-layer resist. In an example shown in FIG. 23A, a resist mask is formed of two resist layers 138*c* and 138*d*, and an opening in the top layer 138*c* is larger than that in the bottom layer 138*d*. In another example shown in FIG. 23B, a resist mask is formed of three resist layers 138*e*, 138*f* and 138*g*, but with openings of the same size in the three layers. Then, a protrusion 13*c*, 13*d* is formed in the openings. The top layers 138*c*, 138*e* are made of a soluble resist. Then, after the top layers 138*c*, 138*e* are dissolved, the gap is widened, and the liquid passes easily. Then, the lower resists 138*d*, 138*f* and 138*g* can be easily removed. A similar advantage can be realized if at least one layer in a multi-layer resist mask is made of a soluble resist.

Embodiment 7

If an electrode for driving a piezoelectric plate is formed not along a whole width of a piezoelectric vibrator, but along a part of the whole width and polarization of the piezoelectric plate is performed by applying a voltage through the electrode, polarization is not generated in the portion on which the electrode is not formed. Then, imbalance of internal stress occurs inside the piezoelectric plate at an interface between the above-mentioned portion without electrodes and the other portion, and this may cause cracking in the piezoelectric plate.

Figure 24:
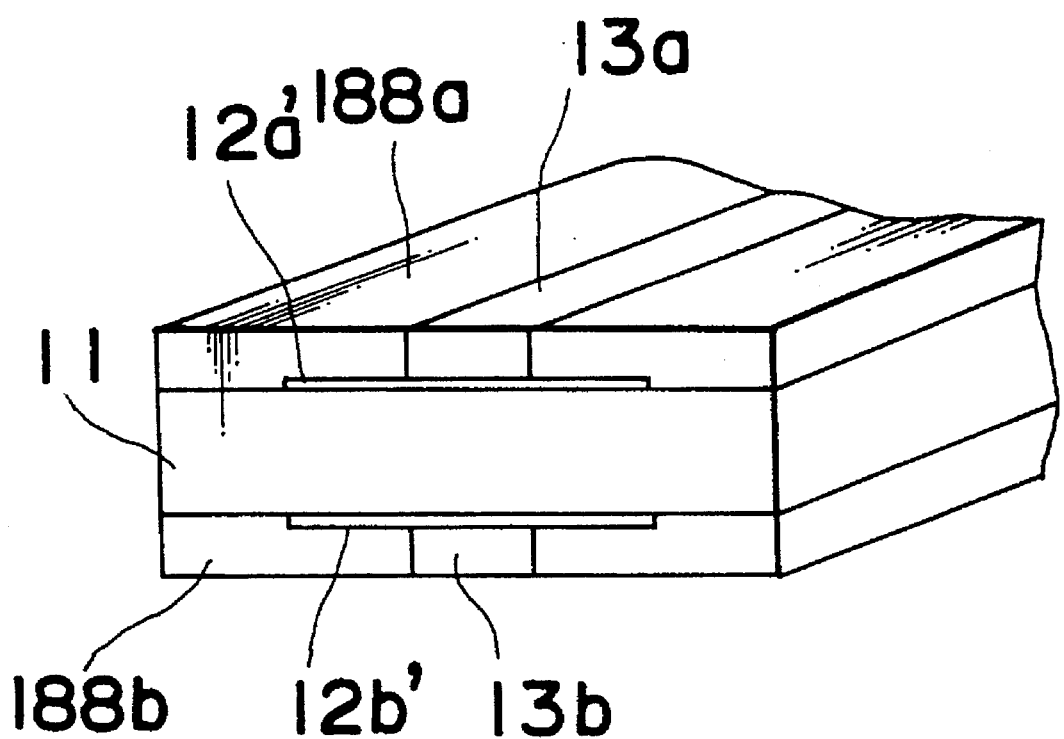
FIG. 24 is a perspective view of a piezoelectric vibrator element.

A seventh embodiment of the invention solves this problem on the polarization. As shown in FIG. 24, electrodes 12*a*' and 12*b*' are formed on a piezoelectric plate 11 partly in the width direction. Then, before forming protrusions 13*a*, 13*b*, electrically conductive resist mask 188*a*, 188*b* are formed on the whole principal planes, except for the openings for protrusions. Next, the protrusions 13*a*, 13*b* are formed in the openings. The piezoelectric plate 11 is polarized with the use of the electrically conductive resist mask 188. Thus, the piezoelectric plate 11 can be polarized completely, including the portion on which the electrode 12*a*', 12*b*' are not formed Because the polarization occurs uniformly inside the piezoelectric plate 11, no imbalance of internal stresses is generated. That is, the above-mentioned problem is solved, and the characteristics of a piezoelectric plate are improved and the yield of a piezoelectric vibrator is improved. Next, the piezoelectric vibrator produced as described above is constructed as shown in FIG. 20 with the plates 135*a*, 135*b* and the like. Alternately, a piezoelectric vibrator obtained as described above is cut off by a portion on which the electrode 12*a*' and 12*b*' are not formed, and it is used to construct a structure as shown in FIG. 20.

The protrusion 13 may be formed after the polarization of the piezoelectric plate 11 as described above. However, though the protrusion 13 is formed by a spraying process which causes a gradual temperature increase, the temperature of the piezoelectric plate 11 increases somewhat. Therefore, it is preferable to cause polarization after forming the protrusions 13.

The resist masks 188*a*, 188*b* are made of a liquid resist material including a prescribed quantity of silver as an electrically conductive material, but they may be made of a material which is electrically conducting, is hard for a sprayed film to be adhered to and can be easily subjected to patterning. The piezoelectric plate 11 itself is an insulator and has a high specific resistivity. Further, the resist mask 188 has a thickness smaller than the piezoelectric plate 11. Therefore, it is preferable that the specific resistivity of the resist masks 188 are smaller than that of the piezoelectric plate 11, for example by three digits. Then, an electrically conductive component is controlled to provide a specific resistivity which" is equal to or below the above-mentioned condition. However, if the added quantity of the electrically conductive material is too large, characteristics such as patterning and elasticity are deteriorated. In such a case, it is added to an order about 1 m$\Omega$·cm. The electrically conductive material may be a metal such as gold, nickel or molybdenum, an alloy thereof, a compound such as an carbide, a boride or an oxide, having an appropriate electrical conductance.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus, comprising:

a piezoelectric plate made of a piezoelectric material, said piezoelectric plate having two principal planes, electrodes on said principal planes and a vibration node;

protrusions at said vibration node on said two principal planes, said protrusions each comprising an electrically conductive material and having a first side in contact with said piezoelectric plate and a contact surface on a second side opposite said first side, said contact surface having a roughness of at least two micrometers; and a holder means for holding said piezoelectric plate at said protrusions on said two principal planes of said piezoelectric plate, said holder means comprising holding members made of an electrically conductive material having contact portions contacting said contact surfaces of said protrusions and having a hardness smaller than the hardness of said protrusions.

2. The apparatus of claim 1, wherein said piezoelectric plate has a linear node of vibration and said protrusions are linear at and along said linear node of vibration.

3. The apparatus of claim 2, wherein said protrusions comprise a plurality of separate and individual protrusions distributed along said linear node of vibration of said piezoelectric plate.

4. The apparatus of claim 3, wherein the positions of said separate and individual protrusions on one of said two principal planes of said piezoelectric plate do not correspond with the positions of said separate and individual protrusions on the other of said two principal planes.

5. An apparatus, comprising:

a piezoelectric plate comprised of a piezoelectric material with two principal planes, electrodes on said principal planes and a vibration node;

protrusions at said vibration node on said two principal planes, said protrusions each comprising an electrically conductive material having a face in contact with said piezoelectric plate and a contact surface at a side of each of said protrusions opposite to said face with a roughness of at least two micrometers; and a holder comprising two portions, said two portions having said protrusions interposed therebetween, said contact surfaces of said protrusions engaging said two portions such that a mechanical bond is formed between said contact surfaces of said protrusions and said two portions.

6. The apparatus of claim 5, wherein said holder comprises a holding member comprising an electrically conductive material having a hardness smaller than the hardness of said protrusions at least at said two portions.

7. The apparatus of claim 6, wherein said piezoelectric plate has a linear node of vibration and said protrusions are linear at and along said linear node of vibration.

8. The apparatus of claim 7, wherein said protrusions comprise one protrusion formed on one of said two principal planes and two protrusions formed on the other of said two principal planes on either side of said linear node of vibration, and said two protrusions have a smaller contact surface in contact with said holder than said one protrusion.

9. The apparatus of claim 7, wherein said protrusions comprise a plurality of individual and separate protrusions distributed along said linear node of vibration of said piezoelectric plate.

10. The apparatus of claim 9, wherein the positions of said individual and separate protrusions on one of said two principal planes of said piezoelectric plate do not correspond with the positions of said individual and separate protrusions on the other of said two principal planes.

11. The apparatus of claim 9, wherein said individual and separate protrusions on one of said principal planes of said piezoelectric plate are larger than said individual and separate protrusions on the other of said principal planes.

12. The apparatus of claim 5, wherein said vibration node of said piezoelectric plate is a point node of vibrations, said protrusions being formed at said point node.

13. The apparatus of claim 5, wherein said holder comprises two plates holding said piezoelectric plate therebetween, said two portions being formed on said two plates, respectively, and a spacer between said two plates spacing said two plates apart and accommodating said piezoelectric plate, said two plates having printed circuits that are electrically conductively connected to said piezoelectric plate.

14. The apparatus of claim 5, wherein at least one of said protrusions has said contact surface thereof in contact with one of said two portions of said holder provided with a larger area than said face thereof, said face being in contact with one of said electrodes on said piezoelectric plate.

15. An apparatus, comprising:
   a piezoelectric plate comprised of a piezoelectric material with two principal planes, electrodes on said principal planes and a vibration node;
   protrusions at said vibration node on said two principal planes, said protrusions each comprising an electrically conductive material and having a face in contact with said piezoelectric plate and a contact surface at a side of each of said protrusions opposite to said face with a roughness of at least two micrometers; and
   a holder comprising two plates, said two plates having a printed circuit electrically conductively connected to said piezoelectric plate and contact areas comprising metallic films, and a spacer located between said two plates and accommodating said piezoelectric plate, said contact surfaces of said protrusions engaging said contact areas such that a mechanical bond is formed between said metallic films and said contact surfaces.

16. An apparatus made by the process comprising the steps of:
   making a piezoelectric plate of a piezoelectric material so as to form two principal planes, electrodes on said principal planes and a vibration node;
   forming a plurality of protrusions at said vibration node on said two principal planes by spraying particles of an electrically conductive material onto said electrodes on said principal planes at different locations at said vibration node, forming a face for each of said protrusions in contact with said piezoelectric plate and a contact surface at a side of each of said protrusions opposite to said face having a roughness of at least two micrometers; and
   engaging a holder with said contact surfaces of said protrusions in order to hold said piezoelectric plate.

17. The apparatus of claim 16, wherein said holder is made of an electrically conductive material having a hardness smaller than the hardness of said protrusions at said contact surfaces thereof.

18. The apparatus of claim 16, wherein said holder comprises two portions that are engaged with said contact surfaces of said protrusions to hold said piezoelectric plate therebetween.

19. The apparatus of claim 16, wherein said piezoelectric plate is made with a linear node of vibration and said protrusions are formed so as to be linear at and along said linear node of vibration.

20. The apparatus of claim 19, wherein one of said protrusions is formed on one of said two principal planes and two of said protrusions are formed on the other of said two principal planes on either side of said linear node of vibration, said two protrusions having a smaller contact surface in contact with said holder than said one protrusion.

21. The apparatus of claim 19, wherein said protrusions are formed as a plurality of individual and separate protrusions distributed along said linear node of vibration of said piezoelectric plate.

22. The apparatus of claim 21, wherein the positions of said individual and separate protrusions on one of said two principal planes of said piezoelectric plate do not correspond with the positions of said individual and separate protrusions on the other of said two principal planes.

23. The apparatus of claim 21, wherein said individual and separate protrusions on one of said principal planes of said piezoelectric plate are larger than said individual and separate protrusions on the other of said principal planes.

24. The apparatus of claim 16, wherein said piezoelectric plate is formed with a point node as said node of vibration, said protrusions being formed at said point node.

25. The apparatus of claim 16, wherein said holder comprises two plates holding said piezoelectric plate therebetween and a spacer between said two plates spacing said two plates apart and accommodating said piezoelectric plate, said two plates having a printed circuit that is electrically conductively connected to said piezoelectric plate.

26. The apparatus of claim 16, wherein at least one of said protrusions has said contact surface thereof, in contact with said holder, provided with a larger area than said face thereof, said face being in contact with one of said electrodes on said piezoelectric plate.

27. The apparatus of claim 16, wherein the spraying in the step of forming said plurality of protrusions comprises passing particles of a size between 5 and 300 μm of an electrically conductive starting material through a high temperature plasma such that the particles are melted, and then blowing the particles along a gas stream toward said piezoelectric plate and depositing the particles at said vibration node to form said protrusions.

* * * * *